(12) United States Patent
Cheng

(10) Patent No.: US 9,276,060 B2
(45) Date of Patent: Mar. 1, 2016

(54) TRIODE

(71) Applicant: Fitipower Integrated Technology, Inc., Hsinchu (TW)

(72) Inventor: Chih-Nan Cheng, Hsinchu (TW)

(73) Assignee: Fitipower Integrated Technology, Inc., Hsinchu (TW)

( * ) Notice: Subject to any disclaimer, the term of this patent is extended or adjusted under 35 U.S.C. 154(b) by 0 days.

(21) Appl. No.: 14/497,778

(22) Filed: Sep. 26, 2014

(65) Prior Publication Data

US 2015/0091050 A1    Apr. 2, 2015

(30) Foreign Application Priority Data

Sep. 30, 2013   (TW) .............................. 102135238 A

(51) Int. Cl.
| | |
|---|---|
| H01L 29/74 | (2006.01) |
| H01L 29/06 | (2006.01) |
| H01L 29/73 | (2006.01) |
| H01L 29/747 | (2006.01) |

(52) U.S. Cl.
CPC ........ *H01L 29/0607* (2013.01); *H01L 29/7302* (2013.01); *H01L 29/747* (2013.01)

(58) Field of Classification Search
CPC . H01L 29/7455; H01L 29/744; H01L 29/749; H01L 29/7395; H01L 29/7397
See application file for complete search history.

(56) References Cited

U.S. PATENT DOCUMENTS

| | | | | |
|---|---|---|---|---|
| 5,717,241 | A * | 2/1998 | Malhi et al. .................... | 257/378 |
| 2002/0158270 | A1 * | 10/2002 | Yamamoto et al. ............ | 257/200 |
| 2013/0075866 | A1 * | 3/2013 | Otake et al. .................... | 257/577 |

* cited by examiner

*Primary Examiner* — Lex Malsawma
*Assistant Examiner* — Long Le
(74) *Attorney, Agent, or Firm* — Novak Druce Connolly Bove + Quigg LLP

(57) ABSTRACT

A triode includes a semiconductor, a deep n-well, a p-well, an n+ doping region, and a doping region. The deep n-well is disposed adjacent to the semiconductor substrate. The p-well is included in the deep n-well and serves as a collector region of the triode. The n+ doping region serves as a base region of the triode. The p+ doping region serves as an emitter region of the triode. The deep n-well is coupled to the n+ doping region via at least one conducting channel.

7 Claims, 11 Drawing Sheets

US 9,276,060 B2

TRIODE

CROSS-REFERENCE TO RELATED APPLICATIONS

This application claims priority to Taiwanese Patent Application No. 102135238 filed on Sep. 30, 2013, the contents of which are incorporated by reference herein.

FIELD

The subject matter herein generally relates to a triode.

BACKGROUND

A triode is an electronic amplifying element. In manufacturing processes of the triode, a parasitic triode is generated. A leak current is generated between an emitter of the parasitic triode and a collector of the parasitic triode which can damage the triode.

BRIEF DESCRIPTION OF THE DRAWINGS

Implementations of the present technology will now be described, by way of example only, with reference to the attached figures.

DETAILED DESCRIPTION

Figure 1:
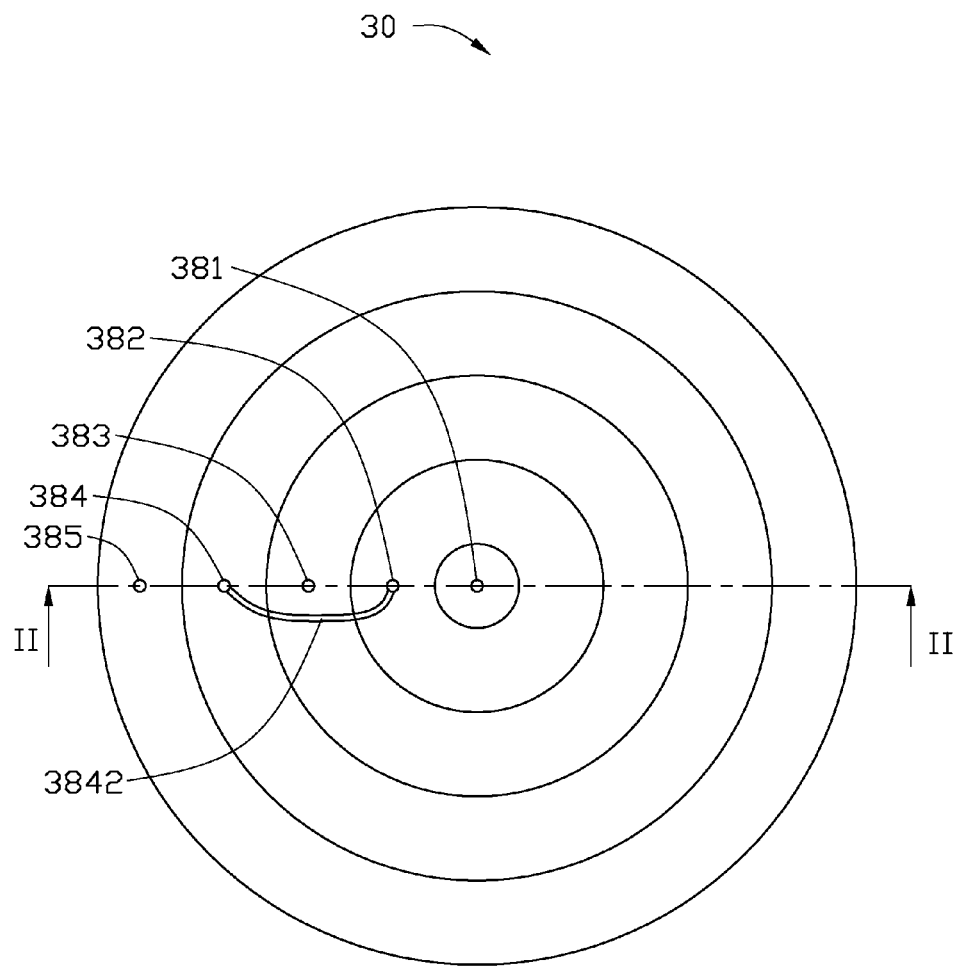
FIG. 1 is a plan view of a triode according to one embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "coupled" is defined as connected, whether directly or indirectly through intervening components, and is not necessarily limited to physical connections. The connection can be such that the objects are permanently connected or releasably connected.

Figure 2:
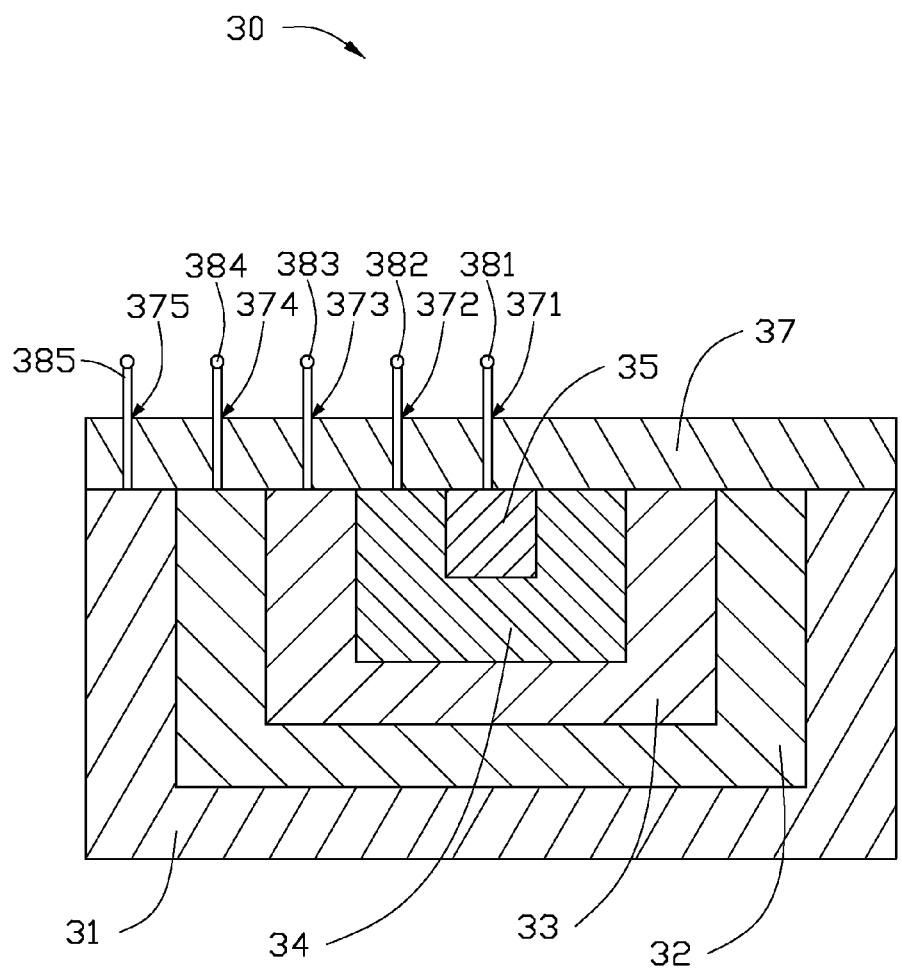
FIG. 2 is a cross-sectional view of the triode according to a first embodiment of FIG. 1 along line II-II.

FIG. 1 illustrates a plan view of a triode 30. FIG. 2 illustrates a cross-sectional view of the triode 30 along line II-II. The triode 30 can include a semiconductor substrate 31, a deep n-well 32, a p-well 33, an n+ doping region 34, and a p+ doping region 35. In the embodiment, the semiconductor substrate 31 is of p-type conductivity. The deep n-well 32 is included in the semiconductor substrate 31. The p-well 33 is disposed adjacent to the deep n-well 32. The n+ doping region 34 is formed by heavily doping n-type impurities in the p-well 33. The p+ doping region 35 is formed by heavily doping p-type impurities in the n+ doping region 34.

In the embodiment, the p+ doping region 35 serves as an emitter region of the triode 30. The n+ doping region 34 serves as a base region of the triode 30. The p-well 33 serves as a collector region of the triode 30. In the embodiment, the p+ doping region 35, the n+ doping region 34, the p-well 33, the deep n-well 32, and the semiconductor substrate 31 are arranged in an annular structure. The p+ doping region 35 is located in a center of the annular structure and the semiconductor substrate 31 is located outside of the annular structure.

The triode 30 can further include a protection layer 37. The protection layer 37 covers a surface of the triode 30 to protect the triode 30. In the embodiment, the protection layer 37 is made of silicon oxide. A first opening hole 371 is defined in the protection layer 37 corresponding to the p+ doping region 35. A first metal wire 381 extends from the first opening hole 371 to receive an emitter voltage. A second opening hole 372 is defined in the protection layer 37 corresponding to the n+ doping region 34. A second metal wire 382 extends from the second opening hole 372 to receive a base voltage. A third opening hole 373 is defined in the protection layer 37 corresponding to the p-well 33. A third metal wire 383 extends from the p-well 33 to receive a collector voltage. A fourth opening hole 374 is defined in the protection layer 37 corresponding to the deep n-well 32. A fourth metal wire 384 extends from the fourth opening hole 374 to couple to the second metal wire 382 via a metal interconnect 3842. A fifth opening hole 375 is defined in the protection layer 37 corresponding to the semiconductor substrate 31. A fifth metal wire 385 extends from the fifth opening hole 375 to receive a substrate voltage. In the embodiment, the fifth metal wire 385 is grounded. In the embodiment, the second metal wire 382, the fourth metal wire 384, and the meal interconnect 3842 serve as a conducting channel to electrically connect to the n+ doping region 34 and the deep n-well 32.

Figure 3:
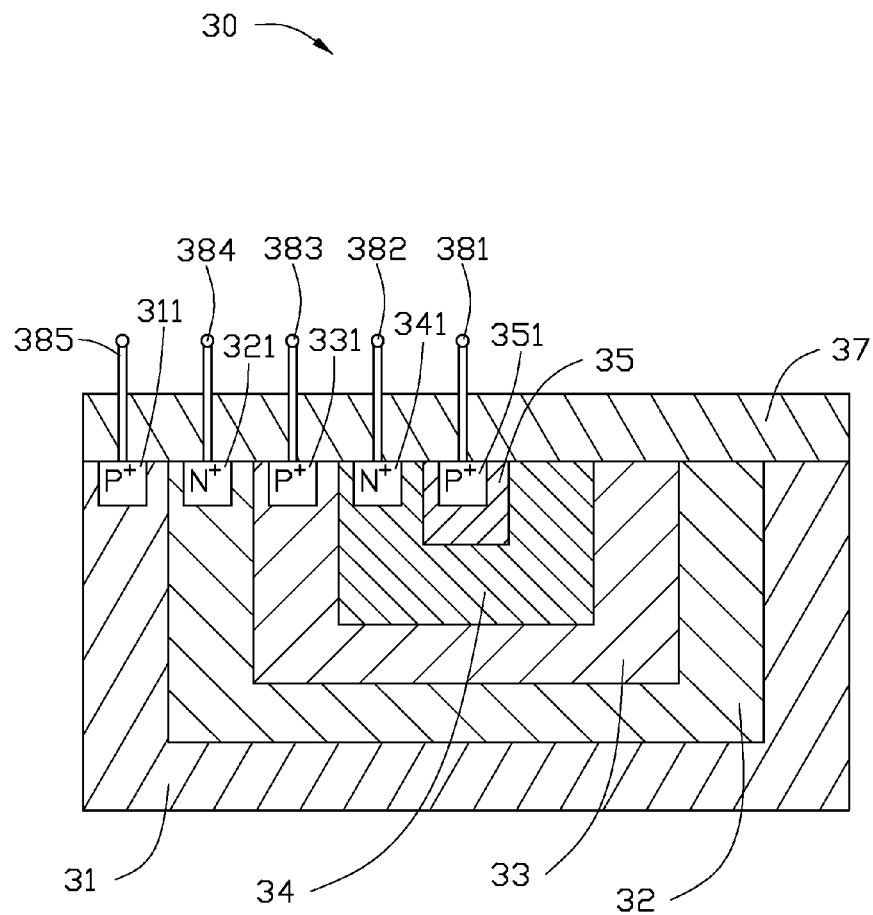
FIG. 3 is a cross-sectional view of the triode according to a second embodiment of FIG. 1 along line II-II.

FIG. 3 illustrates a cross-sectional view of the triode 30 according to a second embodiment. The triode 30 can further include an emitter contact region 351 by doping p-type impurities. The emitter contact region 351 contains a higher doping concentration than that of the p+ doping region 35 to decrease a contact resistance between the first metal wire 381 and the p+ doping region 35. The triode 30 can further include a base contact region 341 by doping n-type impurities. The base contact region 341 contains a higher doping concentration than that of the n+ doping region 34 to decrease a contact resistance between the second metal wire 382 and the n+ doping region 34. The triode 30 can further include a collector contact region 331 by doping p-type impurities. The collector contact region 331 contains a higher doping concentration than that of the p-well 33 to decrease a contact resistance between the third metal wire 383 and the p-well 33. The triode 30 can further include an n-well contact region 321 by doping n-type impurities. The n-well contact region 321 contains a higher doping concentration than that of the deep n-well 32 to decrease a contact resistance between the fourth metal wire 384 and the deep n-well 32. The triode 30 can further include substrate contact region 311 by doping p-type impurities. The substrate contact region 311 contains a higher doping concentration than that of the semiconductor substrate 31 to decrease a contact resistance between the fifth metal wire 385 and the semiconductor substrate 31.

Figure 4:
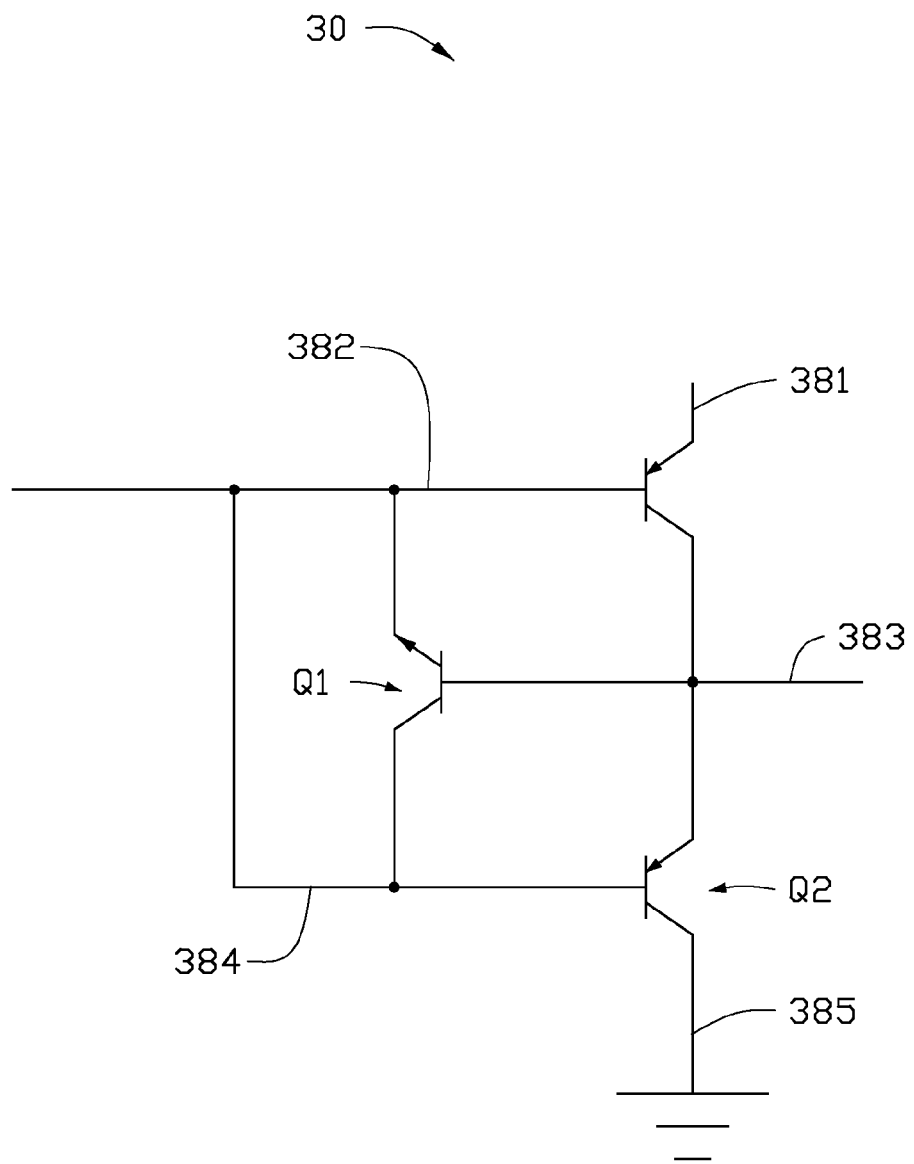
FIG. 4 is an equivalent circuit diagram of the triode of FIG. 1.

FIG. 4 illustrates an equivalent circuit diagram of the triode 30. The triode 30 can include a first parasitic NPN triode Q1 and a second parasitic PNP triode Q2. The first parasitic NPN triode Q1 is formed by the n+ doping region 34, the p-well 33 and the deep n-well 32. The n+ doping region 34 serves as an emitter region of the first parasitic NPN triode Q1, the p-well 33 serves as a base region of the first parasitic NPN triode Q1, and the deep n-well 32 serves as a collector region of the first parasitic NPN triode Q1. The second parasitic NPN triode Q2 is formed by the p-well 33, the deep n-well 32, and the semiconductor substrate 31. The p-well 33 serves as an emitter region of the second parasitic PNP triode Q2, the deep n-well 32 serves as a base region of the second parasitic PNP triode Q2, and the semiconductor substrate 31 serves as a collector region of the second parasitic PNP triode Q2.

The emitter region of the first parasitic PNP triode Q1 is coupled to the base region of the triode 30 via the second metal wire 382. The base region of the first parasitic PNP triode Q1 is coupled to the collector region of the triode 30 and the emitter region of the second parasitic PNP triode Q2 via the third metal wire 383. The collector region of the first parasitic PNP triode Q1 is coupled to the emitter region of the second parasitic PNP triode Q2 and the emitter region of the first parasitic PNP triode Q1 via the fourth metal wire 384. The collector region of the second parasitic PNP triode Q2 is grounded.

In the embodiment, the second metal wire 382 is coupled to the fourth metal wire 384 via the metal interconnect 3842, thus the deep n-well 32 is coupled to the n+ doping region 34, and the deep n-well 32 and the n+ doping region 34 receive the base voltage. A breakdown of the deep n-well 32, the n+ doping region 34 and the p-well 33 can be avoided.

Figure 5:
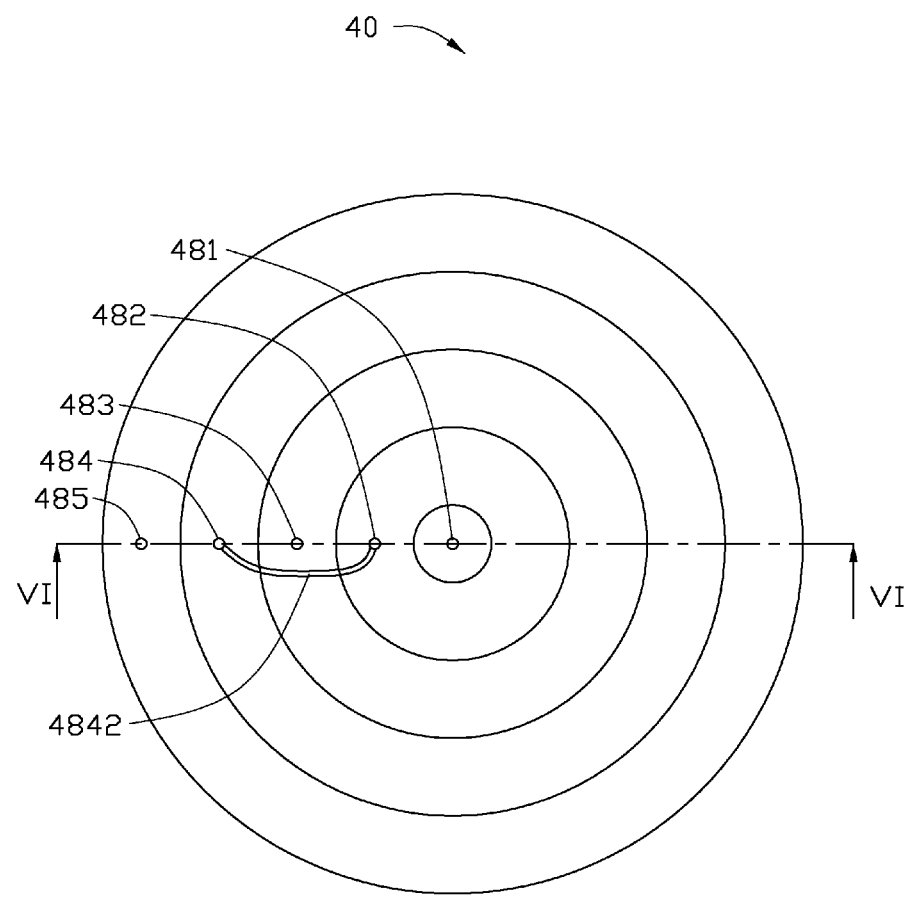
FIG. 5 is a plan view of a triode according to another exemplary embodiment of the present disclosure.
Figure 6:
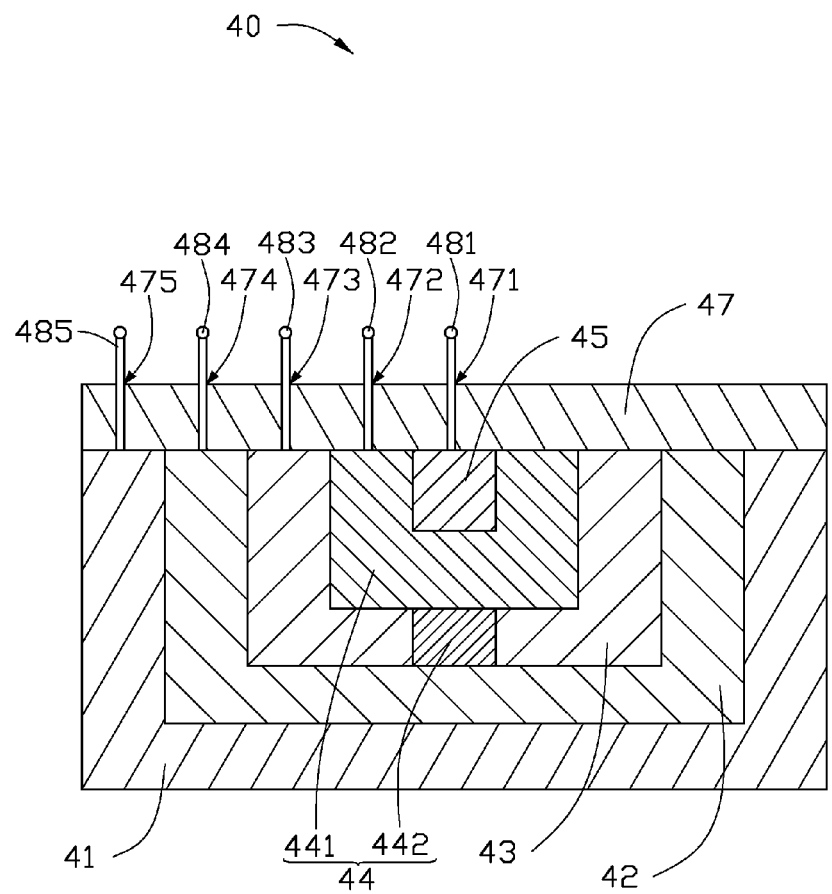
FIG. 6 is a cross-sectional view of the triode according to a first embodiment of FIG. 5 along line VI-VI.

FIG. 5 illustrates a plan view of a triode 40 according to another exemplary embodiment of the present disclosure. FIG. 6 illustrates a cross-sectional view of the triode 40 according to a first embodiment. The triode 40 can include a semiconductor substrate 41, a deep n-well 42, a p-well 43, an n+ doping region 44, and a p+ doping region 45. In the embodiment, the semiconductor substrate is of p-type conductivity. The n+ doping region 44 can include a main body 441 and a connection body 442. The connection body 442 is located in the p-well 43 to divide the p-well 43. The connection body 442 is coupled between the deep n-well 42 and the main body 441. The deep n-well 42 is included in the semiconductor substrate 41. The p-well 43 is disposed adjacent to the deep n-well 42. The n+ doping region 44 is formed by heavily doping n-type impurities in the p-well 43. The p+ doping region 45 is formed by heavily doping p-type impurities in the n+ doping region 44.

In the embodiment, the p+ doping region 45 serves as an emitter region of the triode 40. The n+ doping region 44 serves as a base region of the triode 40. The p-well 43 serves as a collector region of the triode 40. In the embodiment, the p+ doping region 45, the n+ doping region 44, the p-well 43, the deep n-well 42, and the semiconductor substrate 41 are arranged in an annular structure. The p+ doping region 45 is located in a center of the annular structure and the semiconductor substrate 41 is located outside of the annular structure.

The triode 40 can further include a protection layer 47 covering a surface of the triode 40 to protect the triode 40. In the embodiment, the protection layer 47 is made of silicon oxide. A first opening hole 471 is defined in the protection layer 47 corresponding to the p+ doping region 45. A first metal wire 481 extends from the first opening hole 471 to receive an emitter voltage. A second opening hole 472 is defined in the protection layer 47 corresponding to the n+ doping region 44. A second metal wire 482 extends from the second opening hole 472 to receive a base voltage. A third opening hole 473 is defined in the protection layer 47 corresponding to the p-well 43. A third metal wire 483 extends from the p-well 43 to receive a collector voltage. A fourth opening hole 474 is defined in the protection layer 47 corresponding to the deep n-well 42. A fourth metal wire 484 extends from the fourth opening hole 474 to couple to the second metal wire 482 via a metal interconnect 4842. A fifth opening hole 475 is defined in the protection layer 47 corresponding to the semiconductor substrate 41. A fifth metal wire 385 leads from the fifth opening hole 475 to receive a substrate voltage. In the embodiment, the fifth metal wire 385 is grounded.

In the embodiment, the second metal wire 482, the fourth metal wire 484, and the meal interconnect 4842 serve as a first conducting channel to electrically connect to the n+ doping region 44 and the deep n-well 42. The connection body 442 serves as a second conducting channel to electrically connected to the n+ doping region 44 and the deep n-well 42.

In another embodiment, the fourth opening hole 474 and the fourth metal wire 482 are omitted and the main body 441 is coupled to the deep n-well 42 via the connection body 442. The connection body 442 is formed by doping n-type impurities in the p-well 43. The connection body 442 is of higher doping concentration than the deep n-well 42 and lower doping concentration than the main body 441.

Figure 7:
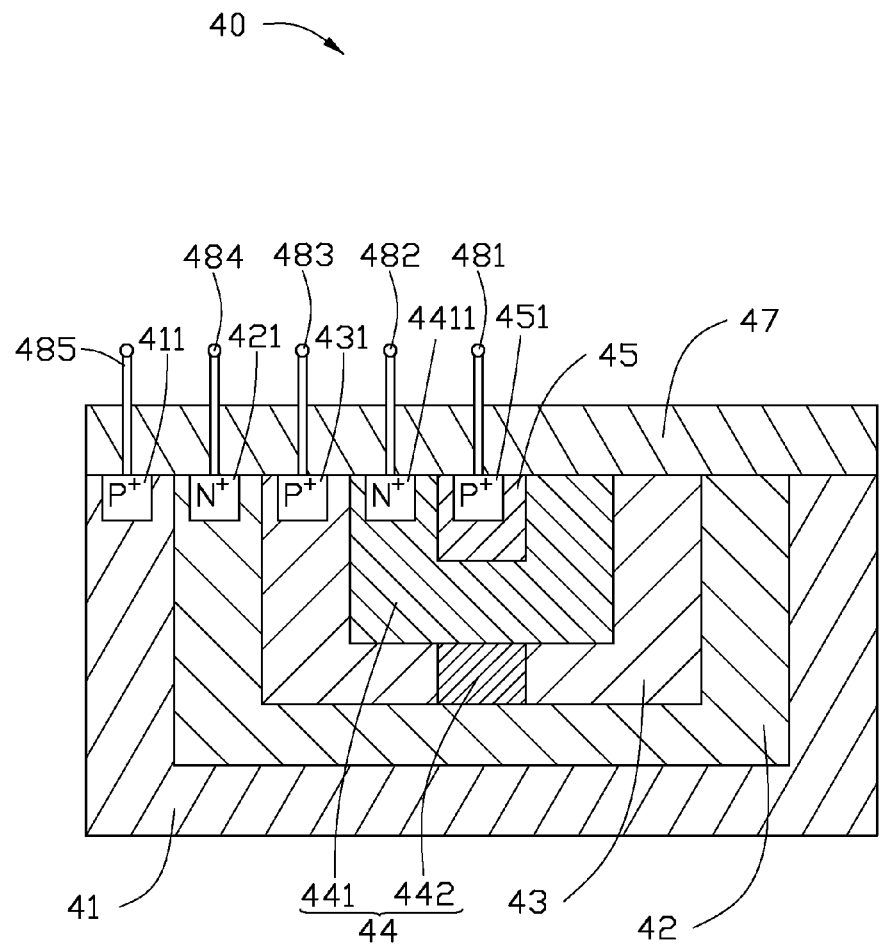
FIG. 7 is a cross-sectional view of the triode according to a second embodiment of FIG. 5 along line VI-VI.
Figure 8:
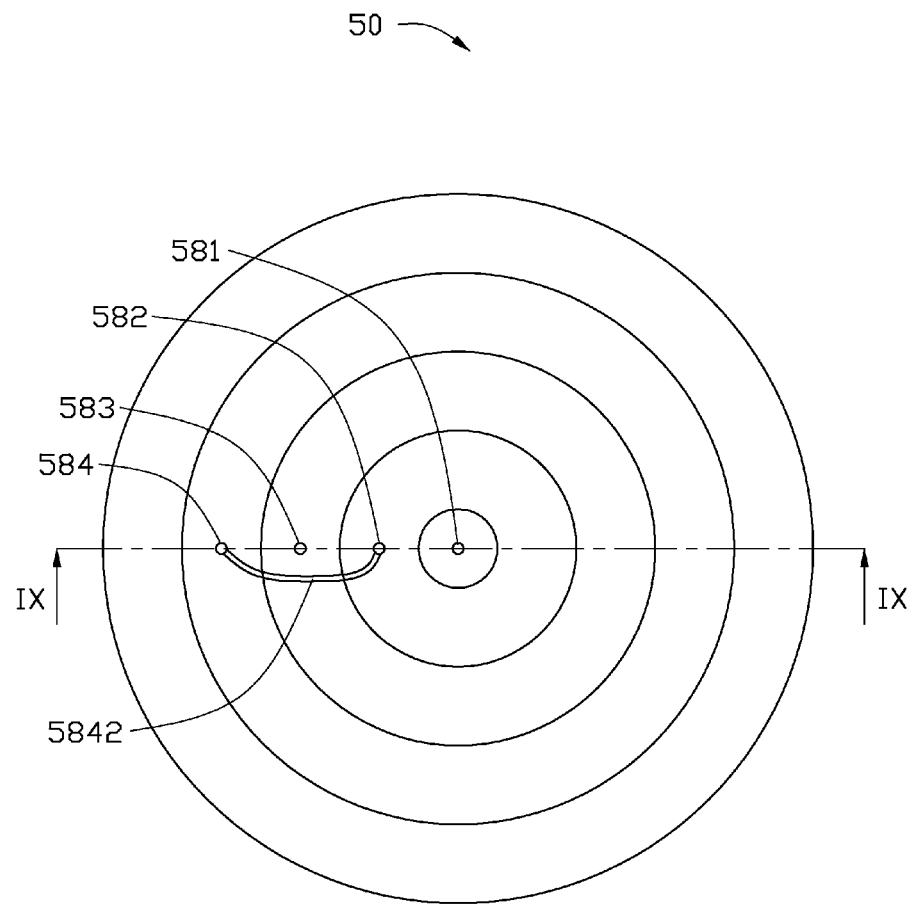
FIG. 8 is a plan view of a triode according to another embodiment of the present disclosure.
Figure 9:
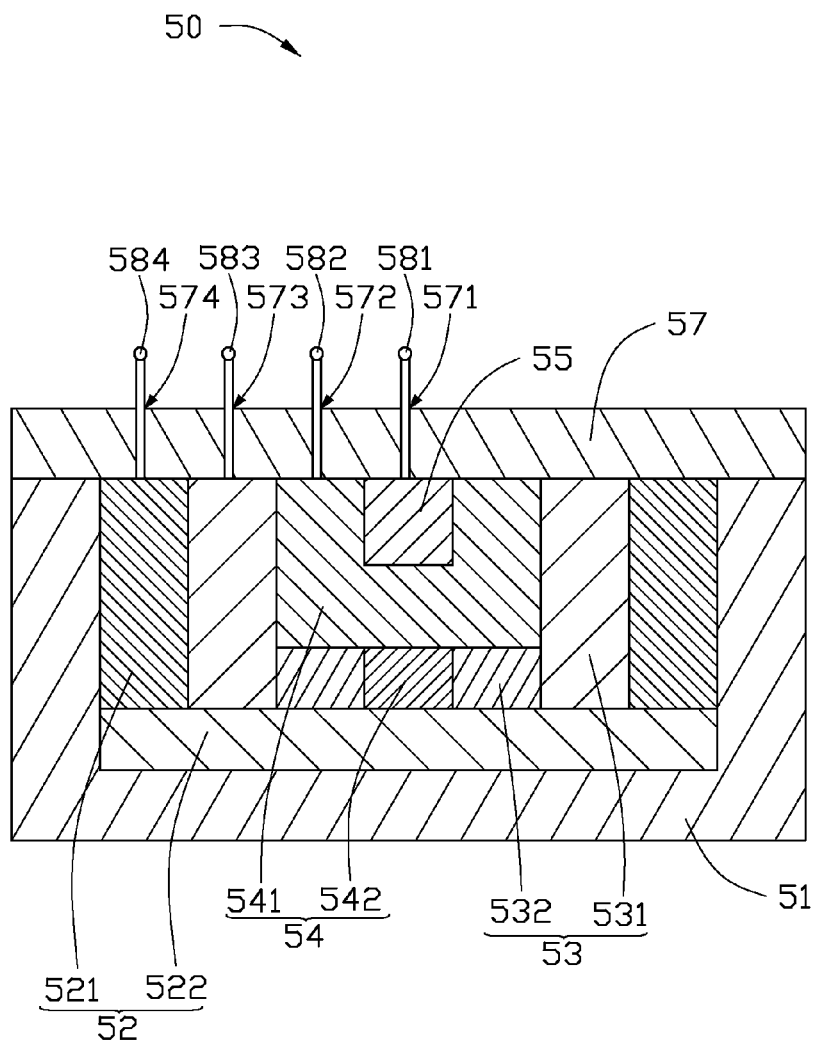
FIG. 9 is a cross-sectional view of the triode according to a first embodiment of FIG. 8 along line IX-IX.

FIG. 7 illustrates a cross-sectional view of the triode 40 according to a second embodiment. The triode 40 can further include an emitter contact region 451 by doping p-type impurities. The emitter contact region 451 contains a higher doping concentration than that of the p+ doping region 45 to decrease a contact resistance between the first metal wire 381 and the p+ doping region 45. The triode 40 can further include a base contact region 4411 by doping n-type impurities. The base contact region 4411 contains a higher doping concentration than that of main body 441 to decrease a contact resistance between the second metal wire 482 and the main body 441. The triode 40 can further include a collector contact region 431 by doping p-type impurities. The collector contact region 431 contains a higher doping concentration than that of the p-well 43 to decrease a contact resistance between the third metal wire 483 and the p-well 43. The triode 40 can further include a substrate contact region 411 by doping p-type impurities. The substrate contact region 411 contains a higher doping concentration than that of the semiconductor substrate 41 to decrease a contact resistance between the fifth metal 485 and the semiconductor substrate 41.

An equivalent circuit of the triode 40 is similar to the equivalent circuit of the triode 30.

FIGS. 8-11 illustrate that a triode 50 can include a semiconductor substrate 51, a deep n-well 52, a p-well 53, an n+ doping region 54, and a p+ doping region 55. In the embodiment, the semiconductor substrate is of p-type conductivity. The n+ doping region 54 can include a main body 541 and a connection body 542. The connection body 542 is located at the p-well 53 to divide the p-well 53. The connection body 542 is coupled between the deep n-well 52 and the main body 541. The p-well 53 can include a first portion 531 and a second portion 532. The second portion 532 is located between the connection body 542 and the first portion 531. The first portion 531 contains a higher doping concentration than that of the second portion 532 to decrease a contact between the collector region and the base region of the triode 50.

The deep n-well 52 can include a first well portion 521 and a second well portion 522. The first well portion 521 and the connection body 542 are located on the second well portion 522. The first well portion 521 is disposed outside of the first portion 531. The first well portion 521 contains a lower doping concentration than that of the second well portion 522. In the embodiment, the second well portion 522 is an N-buried layer.

The triode 50 can further include a protection layer 57 covering a surface of the triode 50 to protect the triode 50. In the embodiment, the protection layer 57 is made of silicon oxide. A first opening hole 571 is defined in the protection 57 corresponding to the p+ doping region 55. A first metal wire 581 extends from the first opening hole 571 to receive an emitter voltage. A second opening hole 572 is defined in the protection layer 57 corresponding to the n+ doping region 54. A second metal wire 582 extends from the second opening hole 572 to receive a base voltage. A third opening hole 573 is defined in the protection layer 57 corresponding to the p-well 53 to receive a collector voltage. A fourth opening hole 574 is defined in the protection layer 57 corresponding to the deep n-well 52 to couple to the second metal wire 582 via a metal interconnect 5842.

The connection body 542 serves as a conducting channel to electrically connected to the main body 541 and the deep n-well 52. In another embodiment, the fourth opening hole 574 and the fourth metal wire 582 are omitted. The connection body 542 is formed by doping n-type impurities in the p-well 53. The connection body 542 is of higher doping concentration than the deep n-well 52 and lower doping concentration than the main body 541.

Figure 10:
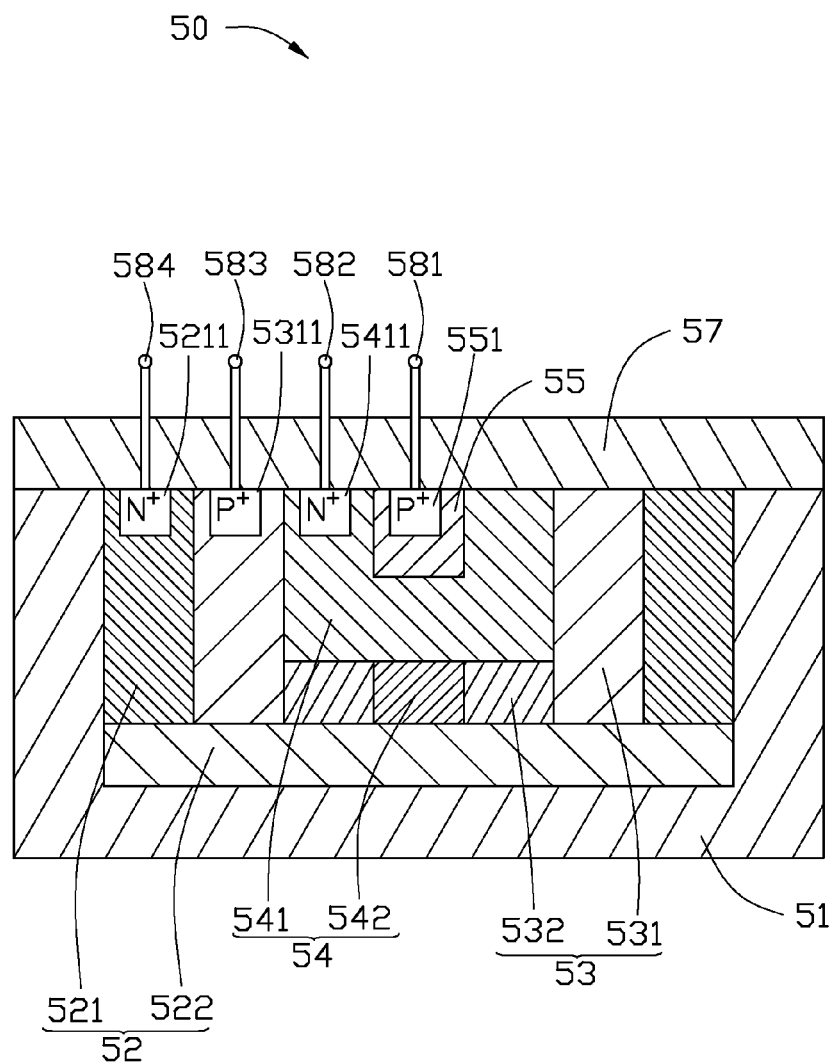
FIG. 10 is a cross-sectional view of the triode according to a second embodiment of FIG. 8 along line IX-IX.

FIG. 10 illustrates a cross-sectional view of the triode 50 according to a second embodiment along line IX-IX. The triode 50 is similar to the triode of FIG. 9 except that the triode 50 can further include an emitter contact region 551, a base contact region 5411, a collector contact region 5311, and a well contact region 5211. The emitter contact region 551 is formed by doping p-type impurities. The emitter contact region 551 contains a higher doping concentration than that of the p+ doping region 55 to decrease a contact resistance between the first metal wire 581 and the p+ doping region 55. The base contact region 5411 is formed by doping n-type impurities. The base contact region 5411 contains a higher doping concentration than that of the main body 541 to decrease a contact resistance between the second wire 582 and the first portion 531 of the p-well 53. The collector contact region 531 is formed by doping p-type impurities. The collector contact region 531 contains a higher doping concentration than that of the first portion 531 of the p-well 53 to decrease a contact resistance between the third metal wire 583 and the p-well 53. The well contact region 5211 contains a higher doping concentration than that of the first well portion 521 of the deep n-well to decrease a contact resistance between the fourth metal 584 and the deep n-well.

Figure 11:
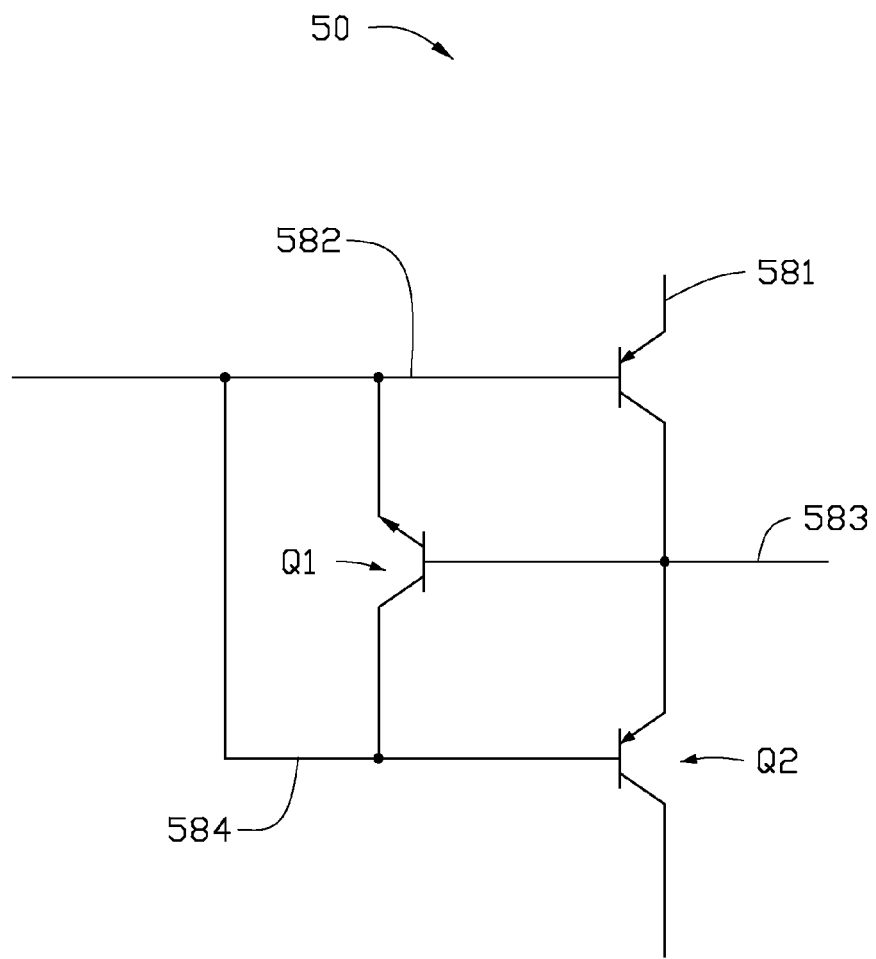
FIG. 11 is an equivalent circuit diagram of the triode of FIG. 8.

An equivalent circuit of the triode 50 as shown in FIG. 11 is similar to the equivalent circuit of the triode 30 except that the collector of the second parasitic PNP triode Q2 is floating.

It is to be understood that even though numerous characteristics and advantages of the present embodiments have been set forth in the foregoing description, with details of the structures and functions of the embodiments, the disclosure is illustrative only. Changes may be made in the details, especially in the matter of arrangement of parts within the principles of the embodiments, to the full extent indicated by the broad general meaning of the terms in which the appended claims are expressed.

What is claimed is:

1. A triode, comprising:
   a semiconductor substrate;
   a deep n-well adjacent to the semiconductor substrate;
   a p-well serving as a collector region of the triode;
   an n+ doping region serving as a base region of the triode;
   a p+ doping region serving as an emitter region of the triode; and
   at least one conducting channel electrically connected to the deep n-well and the n+ doping region;
   wherein a first metal wire extends from the p+ doping region to receive an emitter voltage, a second metal wire extends from the n+ doping region to receive a base voltage, a third metal wire extends from the p-well to receive a collector voltage, and a fourth metal wire extends from the deep n-well to receive the emitter voltage; and the second metal wire is coupled to the fourth metal wire via a metal interconnect arranged outside of the p-well; the second metal wire, the fourth metal wire and the metal interconnect serve as a first conducting channel electrically connected to the deep n-well and the n+ doping region; and
   an emitter contact region, a base contact region, a collector contact region, and a well contact region, the emitter contact region contains a higher doping concentration than that of the p+ doping region, the base contact region contains a higher doping concentration than that of the n+ doping region, the collector contact region contains a higher doping concentration than that of the p-well, and the well contact region contains a higher doping concentration than that of the deep n-well.

2. A triode comprising:
   a semiconductor substrate;
   a deep n-well adjacent to the semiconductor substrate;
   a p-well serving as a collector region of the triode;
   an n+ doping region serving as a base region of the triode;
   a p+ doping region serving as an emitter region of the triode; and
   at least one conducting channel electrically connected to the deep n-well and the n+ doping region;
   wherein a first metal wire extends from the p+ doping region to receive an emitter voltage, a second metal wire extends from the n+ doping region to receive a base voltage, a third metal wire extends from the p-well to receive a collector voltage, and a fourth metal wire extends from the deep n-well to receive the emitter voltage;
   wherein the n+ doping region comprises a main body and connection body, and the connection body is located in the p-well to divide the p-well and coupled between the deep n-well and the main body, the connection body serves as a first conducting channel electrically connected to the deep n-well and the n+ doping region.

3. The triode of claim 2, wherein the p-well comprises a first portion and a second portion located between the connection body and the first portion and the first portion contains a higher doping concentration than that of the second portion.

4. The triode of claim 2, wherein the deep n-well comprises a first well portion and a second well portion, the first well portion and the connection body are located on the second well portion, the first well portion is disposed outside of the first portion, and the first well portion contains a lower doping concentration than that of the second well portion.

5. A triode, comprising:
a semiconductor substrate with a first conductivity;
a deep well with a second conductivity included in the semiconductor substrate;
a lightly doping region with the first conductivity serving as a collector region of the triode and included in the deep well;
a first highly doping region with the second conductivity serving as a base region of the triode and included in the p-well;
a second highly doping region with the first conductivity serving as an emitter region of the triode; and
at least one conducting channel electrically connected to the deep well and the first highly doping region;
wherein a first metal wire extends from the second highly doping region to receive an emitter voltage, a second metal wire extends from the first highly doping region to receive a base voltage, a third metal wire extends from the lightly doping region to receive a collector voltage, and a fourth metal wire extends from the deep well to receive the emitter voltage, and the second metal wire is coupled to the fourth metal wire via a metal interconnect arranged outside of the lightly doping region; the second metal wire, the fourth metal wire and the metal interconnect serve as a first conducting channel electrically connected to the deep n-well and the first highly doping region; and
wherein the first highly doping region comprises a main body and connection body, and the connection body is located in the lightly doping region to divide the lightly doping region and coupled between the deep well and the main body, the connection body serves as a second conducting channel electrically connected to the deep well and the first highly doping region.

6. The triode of claim 5, wherein the lightly doping region comprises a first portion and a second portion located between the connection body and the first portion and the first portion contains a higher doping concentration than that of the second portion.

7. The triode of claim 5, wherein the deep well comprises a first well portion and a second well portion, the first well portion and the connection body are located on the second well portion, the first well portion is disposed outside of the first portion, and the first well portion contains a lower doping concentration than that of the second well portion.

* * * * *